US008058161B2

(12) United States Patent
Barna et al.

(10) Patent No.: US 8,058,161 B2
(45) Date of Patent: Nov. 15, 2011

(54) RECESSED STI FOR WIDE TRANSISTORS

(75) Inventors: Gabriel George Barna, Richardson, TX (US); Andrew Marshall, Dallas, TX (US); Brian K. Kirkpatrick, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 169 days.

(21) Appl. No.: 11/541,267

(22) Filed: Sep. 29, 2006

(65) Prior Publication Data

US 2008/0081404 A1   Apr. 3, 2008

(51) Int. Cl.
 *H01L 21/336* (2006.01)
(52) U.S. Cl. . 438/589; 438/437; 438/702; 257/E21.429; 257/E21.546
(58) Field of Classification Search ............... 438/296, 438/424, 435, 437, 589, 700, 702
See application file for complete search history.

(56) References Cited

U.S. PATENT DOCUMENTS

| | | | |
|---|---|---|---|
| 4,393,391 A * | 7/1983 | Blanchard | 257/343 |
| 6,281,555 B1 | 8/2001 | Yu et al. | |
| 6,746,933 B1 | 6/2004 | Beintner et al. | |
| 6,913,969 B2 * | 7/2005 | Yoo | 438/248 |
| 6,960,818 B1 | 11/2005 | Rengarajan et al. | |
| 2002/0135025 A1 | 9/2002 | Park | |
| 2004/0119142 A1 | 6/2004 | Grossi et al. | |
| 2005/0186740 A1 | 8/2005 | Kim | |
| 2005/0285204 A1 * | 12/2005 | Kim et al. | 257/368 |
| 2006/0040462 A1 * | 2/2006 | Wu et al. | 438/424 |
| 2007/0023791 A1 * | 2/2007 | Kim et al. | 257/288 |

OTHER PUBLICATIONS

"Fin-Channel-Array Transistor (FCAT) Featuring Sub-70nm Low Power and High Performance DRAM" Deok-Hyung Lee, Byung-Chan Lee, In-Soo Jung, Taek Jung Kim, Yong-Noon Son, Sun-Ghil Lee, Young-Phil Kim, Siyoung Choi, U-In Chung and Joo-Tae Moon, IEEE, IEDM 03-407, May 2003, pp. 17.1.1-17.1.4.
"Static Noise Margin of the Full DG-CMOS, SRAM Cell Using Bulk FinFETs (Omega MOSFETs)" T. Park, H.J. Cho, J.D. Choe, S.Y. Han, S.-M. Jung, J.H. Jeong, B.Y. Nam, O.I. Kwon, J.N. Han, H.S. Kang, M.C. Chae, G.S. Yeo, S. W. Lee, D.Y. Lee, D. Park, K. Kim, E. Yoon and J.H. Lee, IEEE, IEDM 03-27, pp. 2.2.1-2.2.4.
"Fabrication of Body-Tied FinFETs (Omega MOSFETs) Using Bulk Si Wafers" T. Park, S. Choi, D.H. Lee, J.R. Yoo, B.C. Lee, J.Y. Kim, C.G. Lee, K.K. Chi, S.H. Hong, S.J. Hyun, Y.G. Shin, J.N. Han, I.S. Park, U I. Chung, J.T. Moon, E. Yoon, and J.H. Lee, 2003 Symposium on VLSI Technology Digest of Technical Papers, pp. 135-136.
Device Characteristics of Scaled Planar and Non-Planar CMOS Transistors for Sub-65nm Technology Generation Jeong-Hwan Yang, TD P/J Technology Development System LSI Division, Oct. 22, 2003, pp. 1-77.

* cited by examiner

*Primary Examiner* — Mary Wilczewski
*Assistant Examiner* — Toniae Thomas
(74) *Attorney, Agent, or Firm* — Warren L. Franz; Wade J. Brady, III; Frederick J. Telecky, Jr.

(57) ABSTRACT

A method of manufacturing a semiconductor device having shallow trench isolation includes steps of forming a hard mask layer on the substrate surface, etching a trench through the hard mask, filling the trench with an isolation material, forming a recessed trench, and forming a serpentine gate structure to connect electronic sources and drains.

20 Claims, 13 Drawing Sheets

| 1m m ACTIVE | | | | | | | | | |
|---|---|---|---|---|---|---|---|---|---|
| INITIAL 1000 nm ACTIVE | 1000 | 1000 | 1000 | 1000 | 1000 | 1000 | 1000 | 1000 | 1000 |
| STI MINIMUM WIDTH (nm) | 70 | 70 | 70 | 70 | 70 | 70 | 70 | 70 | 70 |
| NUMBER STI WITHIN INITIAL ACTIVE WIDTH | 0 | 1 | 2 | 3 | 4 | 5 | 6 | 7 | |
| SEGMENTED ACTIVE TOTAL WIDTH (nm) | 1000 | 930 | 860 | 790 | 720 | 650 | 580 | 510 | |
| SEGMENTED ACTIVE INDIVIDUAL WIDTH (nm) | 1000.0 | 465.0 | 286.7 | 197.5 | 144.0 | 108.3 | 82.9 | 63.8 | |
| NUMBER VERTICAL GATES | 2 | 4 | 6 | 8 | 10 | 12 | 14 | 16 | |
| STI RECESS DEPTH (nm) | 60 | 60 | 60 | 60 | 60 | 60 | 60 | 60 | |
| VERTICAL GATE ION EFFICIENCY | 0.7 | 0.7 | 0.7 | 0.7 | 0.7 | 0.7 | 0.7 | 0.7 | |
| (SEGMENTED ACTIVE+RECESS*EFF) Wg (nm) | 1084 | 1098 | 1112 | 1126 | 1140 | 1154 | 1168 | 1182 | |
| $I_{DRIVE}$ INCREASE/INITIAL 1000 nm ACTIVE | 0.084 | 0.098 | 0.112 | 0.126 | 0.14 | 0.154 | 0.168 | 0.182 | |

| | 5mm ACTIVE | | | | | | | | |
|---|---|---|---|---|---|---|---|---|---|
| 3002 — INITIAL 5000 nm ACTIVE | 5000 | 5000 | 5000 | 5000 | 5000 | 5000 | 5000 | 5000 | 5000 |
| 3004 — STI MINIMUM WIDTH (nm) | 70 | 70 | 70 | 70 | 70 | 70 | 70 | 70 | 70 |
| 3006 — NUMBER STI WITHIN INITIAL ACTIVE WIDTH | 0 | 5 | 10 | 15 | 20 | 25 | 30 | 35 | |
| 3008 — SEGMENTED ACTIVE TOTAL WIDTH (nm) | 5000 | 4650 | 4300 | 3950 | 3600 | 3250 | 2900 | 2550 | |
| 3010 — SEGMENTED ACTIVE INDIVIDUAL WIDTH (nm) | 5000.0 | 775.0 | 390.9 | 246.9 | 171.4 | 125.0 | 93.5 | 70.8 | |
| 3012 — NUMBER VERTICAL GATES | 2 | 12 | 22 | 32 | 42 | 301 | 62 | 72 | |
| 3014 — STI RECESS DEPTH (nm) | 60 | 60 | 60 | 60 | 60 | 60 | 60 | 60 | |
| 3016 — VERTICAL GATE ION EFFICIENCY | 0.7 | 0.7 | 0.7 | 0.7 | 0.7 | 0.7 | 0.7 | 0.7 | |
| 3018 — (SEGMENTED ACTIVE+RECESS*EFF) Wg (nm) | 5084 | 30054 | 30124 | 30194 | 5364 | 5434 | 5504 | 5574 | |
| 3020 — $I_{DRIVE}$ INCREASE/INITIAL 5000 nm ACTIVE | 0.017 | 0.031 | 0.045 | 0.059 | 0.073 | 0.087 | 0.101 | 0.115 | |

| | | | | | | | | | |
|---|---|---|---|---|---|---|---|---|---|
| 10nm ACTIVE | | | | | | | | | |
| INITIAL 10000 nm ACTIVE | 10000 | 10000 | 10000 | 10000 | 10000 | 10000 | 10000 | 10000 | 10000 |
| STI MINIMUM WIDTH (nm) | 70 | 70 | 70 | 70 | 70 | 70 | 70 | 70 | 70 |
| NUMBER STI WITHIN INITIAL ACTIVE WIDTH | 0 | 10 | 20 | 30 | 40 | 50 | 60 | 70 | |
| SEGMENTED ACTIVE TOTAL WIDTH (nm) | 10000 | 9300 | 8600 | 7900 | 7200 | 6500 | 5800 | 5100 | |
| SEGMENTED ACTIVE INDIVIDUAL WIDTH (nm) | 10000.0 | 845.5 | 409.5 | 254.8 | 175.6 | 127.5 | 95.1 | 71.8 | |
| NUMBER VERTICAL GATES | 2 | 22 | 42 | 62 | 82 | 102 | 122 | 142 | |
| STI RECESS DEPTH (nm) | 60 | 60 | 60 | 60 | 60 | 60 | 60 | 60 | |
| VERTICAL GATE ION EFFICIENCY | 0.7 | 0.7 | 0.7 | 0.7 | 0.7 | 0.7 | 0.7 | 0.7 | |
| (SEGMENTED ACTIVE+RECESS*EFF) Wg (nm) | 10084 | 10224 | 10364 | 10504 | 10644 | 10784 | 10924 | 11064 | |
| $I_{DRIVE}$ INCREASE/INITIAL 10000 nm ACTIVE | 0.008 | 0.022 | 0.036 | 0.050 | 0.064 | 0.078 | 0.092 | 0.106 | |

FIG. 31

RECESSED STI FOR WIDE TRANSISTORS

FIELD OF INVENTION

The present invention relates generally to the fabrication of integrated circuits and more particularly to methods for creating recessed STI for wide transistors in order to increase the drive current ($I_{on}$) of the transistors, wherein the leakage current ($I_{off}$) remains relatively constant.

BACKGROUND OF THE INVENTION

Integrated circuits are manufactured by fabricating electrical devices on semiconductor substrates and interconnecting the various electrical devices. Shallow trench isolation (STI) is a technique used to electrically isolate transistors or electrical devices and is a facilitating technology for the fabrication of advanced microelectronic devices, for example, complementary metal-oxide-semiconductors (CMOS). STI has largely replaced localized oxidation of silicon (LOCOS) isolation methods in the fabrication of advanced microelectronic devices. STI involves creating oxide isolation trenches for electrical separation or segregation in integrated circuits in order to avoid electromechanical interference (EMI) and/or parasitic leakage paths between the various devices. The oxide trench is etched into the silicon substrate utilizing, for example, reactive ion etching (RIE), followed by employing a thermal oxidation process to line the trench walls with a thin layer of oxide, for example, $SiO_2$. The trench is then filled with a gap-filling oxide isolation material. The structure is subsequently chemically mechanically polished (CMP) to create a planar STI structure such that electrical devices (inner active areas) can be formed within regions bounded by the STI, often referred to as moats.

The $W_g$ (gate width) of small transistors, for example, static random access memory (SRAM) transistors is limited by the process constraints of the required "footprint" of the device. Given specific pitch and space limitations, the $W_g$ of the SRAM is constrained within specific physical limits. A small gate width ($W_g$) can lead to small drive currents ($I_{ON}$) in minimum size transistors. An increase in drive current ($I_{ON}$) at no or a small increase in leakage current ($I_{OFF}$), for a given "footprint", would provide a significant benefit over the current available technology.

FinFET structures, currently being used in some of the smallest memory devices (e.g., SRAM), are not suitable for wide transistor type applications, for example, large switches. FinFET transistors generally have higher current densities than most CMOS devices; however, the fins of FinFETs are not as wide as the "fins" of wide transistors because most of the FinFET world is aimed at narrow transistors. FinFETs are typically less than 100 nm in width and therefore not suitable for wide transistor applications.

Thus, there exists a need for an improved system and method for creating wide transistors with increased drive current with little or no increase in leakage current. In other words, there exists a need for improving the drive current ($I_{ON}$) per unit width without a proportional increase in leakage current ($I_{OFF}$).

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The present invention relates to methodologies allowing the creation of recessed STI for wide transistor semiconductor devices, by which the above mentioned and other difficulties encountered in the prior art may be mitigated.

Toward that end, the invention may be employed to increase the effective width of the active area for a given transistor spatial footprint, at the existing lithographic limits or technology node, by forming STI structures within a substrate and recessing the sides of the STI, in other words, recessing the STI isolation oxide material below the top surface of the active area. The resultant structure forms a non-planar active area in which the transistor is subsequently fabricated. The physical gate width of the transistor built on such a recessed STI device can be increased without a concurrent increase in the width of the active area.

In accordance with one aspect of the invention, a method is provided for fabricating a recessed STI for wide transistors (e.g., transistors with a width of 100nm - 10,000 nm). The method comprises forming one or more recessed STI structures in an active area of a substrate. In one implementation, the recessed space of the STI trench can be formed to a width of about 100 nm, an aspect ratio of not less than 10:1 (i.e., given a 4,000 Å depth, the minimum width is 40,000Å) and a recess depth of about 10 nm-100 nm. The aspect ratio is defined herein as the ratio of the width of the trench to the depth of the trench. More particularly, in one example, one or more isolation trenches are etched through a nitride and oxide layer (referred to as a hard mask) and into the isolation regions of the substrate surface. The trenches are then coated with a trench oxide and subsequently filled with an isolation material, for example, high density plasma (HDP) oxide that covers the remaining nitride and oxide layers, as well as overfills the trenches. The device is then planarized by employing, for example, chemical mechanical polishing, followed by a deglaze process wherein the substrate is subsequently wet etched to remove a portion of the isolation material in the trench to form the recessed STI.

Also, in accordance with an aspect of this invention, a method for fabricating a recessed isolation STI is provided. The oxide layer and nitride layer formed over the substrate both have thicknesses of, for example, about 100-300 Å. A wet or dry etch process is utilized along with photolytic masking to create isolation trenches that are subsequently filled with isolation material. The substrate is processed by employing CMP, followed with a wet etch, for example, to create a recessed STI.

The following description and annexed drawings set forth in detail certain illustrative aspects and implementations of the invention. These are indicative of only a few of the various ways in which the principles of the invention may be employed.

BRIEF DESCRIPTION OF THE DRAWINGS

FIG. 29 depicts an exemplary table listing exemplary device electrical improvements (benefits) versus physical geometries formed, according to yet another aspect of the present invention;

FIG. 30 depicts an exemplary data listing device electrical improvements (benefits) versus other physical geometries formed, according to an aspect of the present invention;

FIG. 31 depicts an exemplary data listing device electrical improvements (benefits) versus other physical geometries formed, according to an aspect of the present invention;

DETAILED DESCRIPTION OF THE INVENTION

Figure 1:
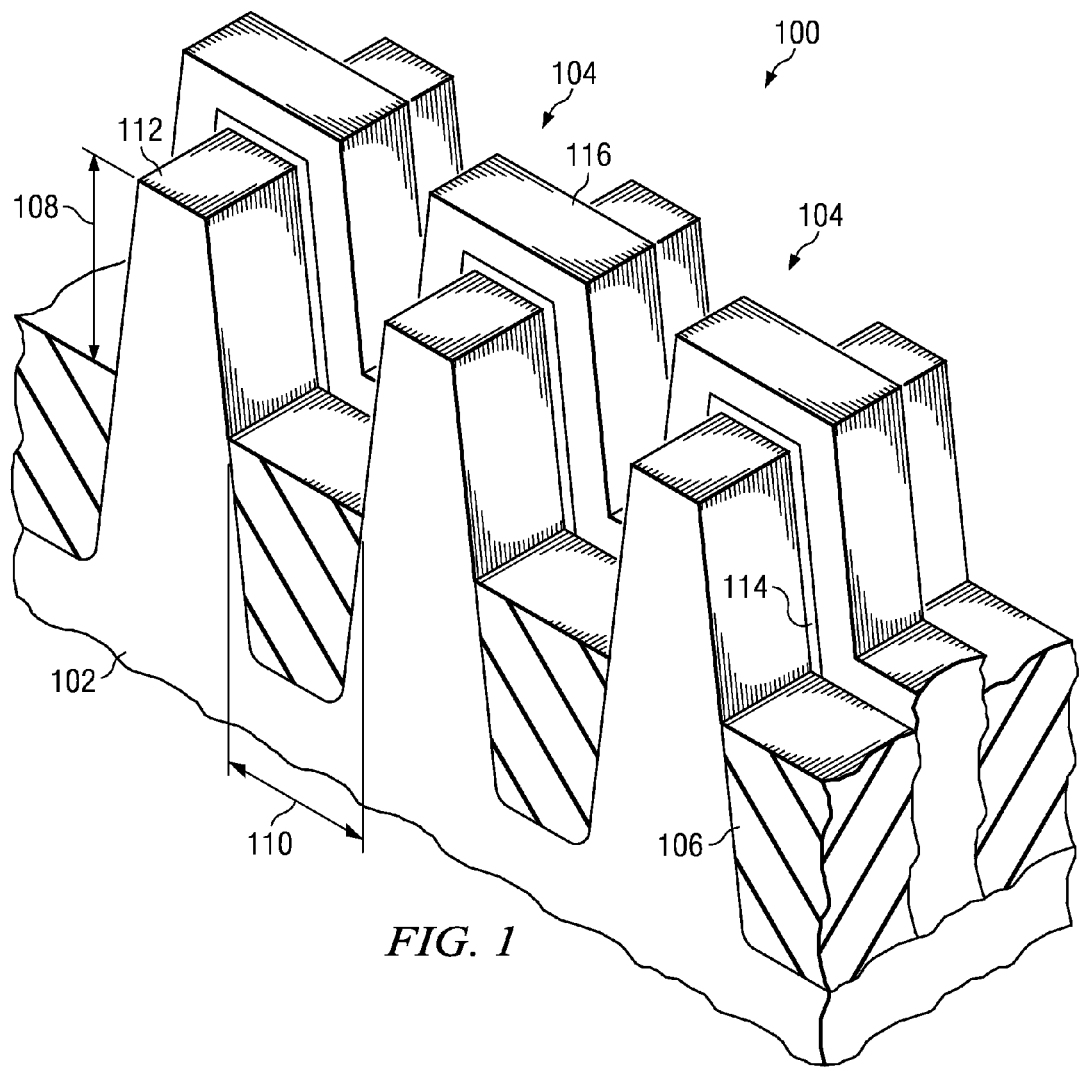
FIG. 1 is a partial side perspective view of a section illustrating formation of a recessed STI according to an embodiment of the invention.

One or more implementations of the present invention will now be described with reference to the attached drawings, wherein the reference numerals are used to refer to like elements throughout, and wherein various structures are not necessarily drawn to scale. The method of the present invention will be described with reference to the formation of recessed shallow trench isolation for wide transistors. However, the method is applicable to other processes, for example, a process for forming any suitable digital or analog electronic device, for example, large switches, I/O devices, logic devices, analog devices, power IC outputs, switches, large inverter switches, and the like. Furthermore, while the following detailed description is presently contemplated by the inventors for practicing the invention, it should be understood that the description of this embodiment is merely illustrative and that it should not be taken in a limiting sense.

The present invention provides for a method of fabricating a recessed STI for wide transistors. Shallow trench isolation (STI) is a method used to electronically isolate microstructures in semiconductors and microelectromechanical systems (MEMS) devices. Many companies employ STI technology to isolate electronic devices (e.g., transistors) on an integrated circuit in order to prevent current leakage between the various devices. STI has replaced the traditional LOCOS (local oxidation of silicon) structures, in some applications due to STI providing a more controlled form of electrical isolation. LOCOS structures, in contrast, typically consume larger amounts of space because the oxidation region expands the isolation area laterally in proportion to the depth of the isolation.

FIG. 1 is described in accordance with the fabrication of a recessed STI wide transistor 100. FIG. 1 illustrates a partial side view of a recessed STI for a wide transistor according to one embodiment of the invention. The present process is associated with shallow trench isolation (STI), which involves a substrate 102, for example silicon, in which trenches 104 are etched and filled, for example, with single or multiple isolation, low-k or other dielectric materials 106. The isolation materials 106, can be, for example silicon dioxide ($SiO_2$), $ZrO_2$, $Al_2O_3$, high density plasma (HDP) oxide, combinations thereof, and the like. The substrate 102 and trench 104 are then processed and re-etched to create a recessed trench 104 of depth 108, wherein the isolation material no longer completely fills the trench. FIG. 1 illustrates an STI trench recess wherein the depth 108, for example, is approximately 80 nanometers (nm). A trench space 110 corresponding to a width in the trench at the top of the isolation material as illustrated in FIG. 1 can be about 40-200 nanometers wide, for example.

Recessing the STI isolation trench isolation material 106 is not generally performed in the manufacture of, for example, CMOS devices. In the present embodiment, the generation of such a recess at the depth 108 is done without creating typical gate oxide integrity (GOI) problems in the end device. The recess depth 108 can result in approximately a 5-50% increase in drive current ($I_{ON}$) without a significant increase in the "off current" ($I_{OFF}$). This will be discussed in detail infra.

The recessed STI wide transistor 100 (e.g., a comb transistor) according to one embodiment of the present invention comprises a plurality of active "teeth" or pillar regions 112 serving as source and drain regions (S/D) and a plurality of the recessed trenches 104 partially filled with the isolation material 106. The active areas are tapered teeth as shown in FIG. 1. Impurity diffusion layers are formed in the semiconductor substrate active regions 112 employing, for example, using a known ion source implantation process, and the like. The impurity diffusion layers or active regions 112 adjoin a gate 116, e.g., polysilicon, etc. The polysilicon gate is formed on a dielectric layer 114.

Figure 2:
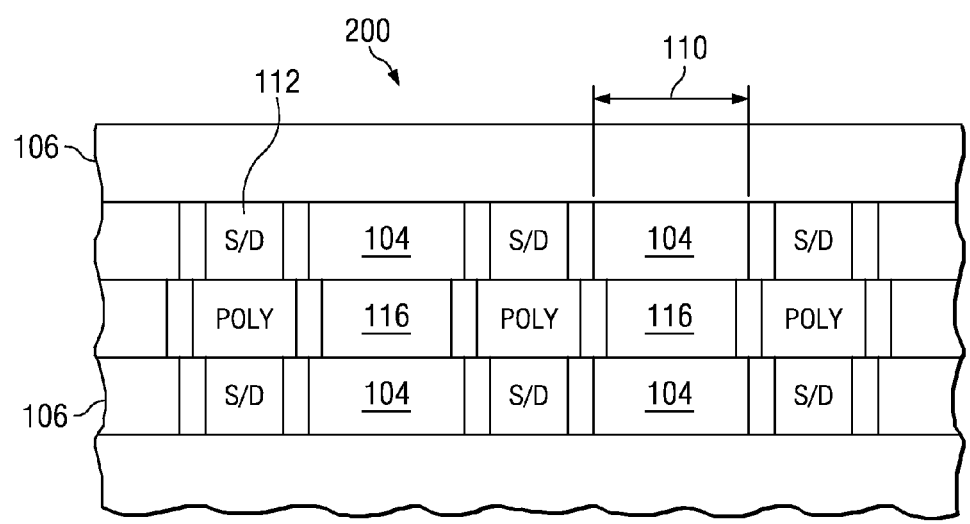
FIG. 2 is a partial top elevation view of a recessed STI in accordance with an exemplary embodiment of the invention.

The recessed STI formed as a "comb transistor" or serpentine structure yields a larger drive current ($I_{ON}$) for the wide transistor than is normally available for a given integrated circuit device with a comparable spatial footprint. As long as the recess depth 108 is greater than one-half the STI space 110, a net increase in $I_{ON}$ can be obtained wherein the leakage current ($I_{OFF}$) remains approximately constant without an increase in the active area. As can be seen, FIG. 2 is a top view of FIG. 1, illustrating the STI recessed wide transistor 200 with a recess depth of approximately 10-100 nm. As shown, in FIGS. 1 and 2, a substrate 102 has several trenches 104 formed within it that are partially filled with isolation material 106 forming recessed trenches. A trench recess depth 108 and trench space 110 width are dimensions used to determine the increase in drive current ($I_{ON}$) associated with a given recess. Active teeth or regions 112 (sources/drains) are those regions of the device that are doped by implanting ions. A polysilicon gate 116 has been laid down on the substrate 102 between the trenches 104, which serve as isolation barriers.

Figure 15:
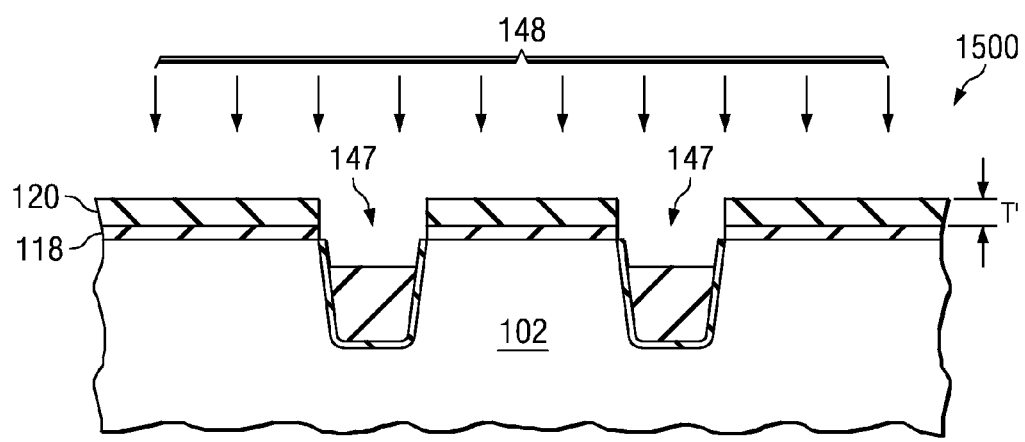
FIG. 15 is a partial side elevation view illustrating the substrate in FIG. 14, following a deglaze process, according to an exemplary embodiment of the invention.
Figure 16:
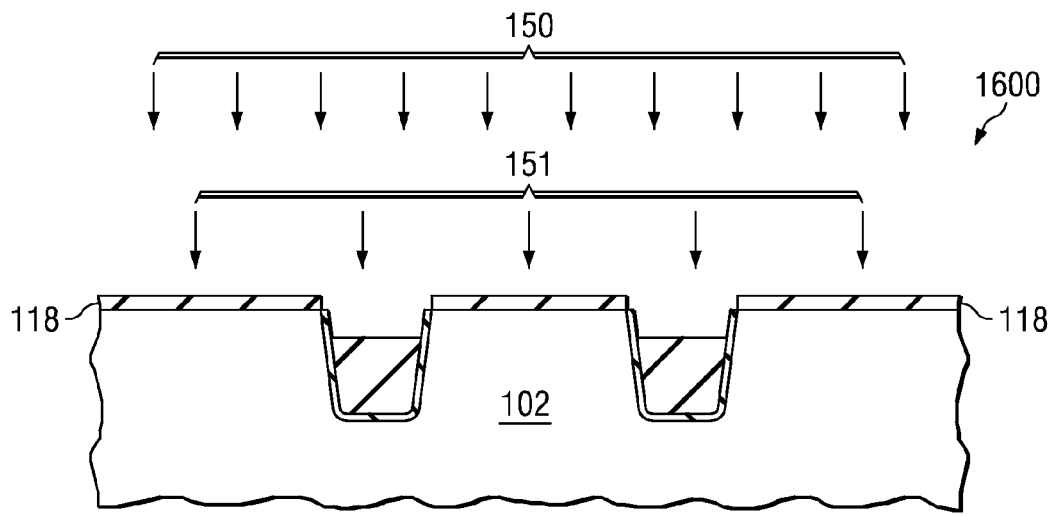
FIG. 16 is a partial side elevation view illustrating the substrate of FIG. 15 following a hot standard clean process, followed by a vapor dry, according to another embodiment of the present invention.
Figure 17:
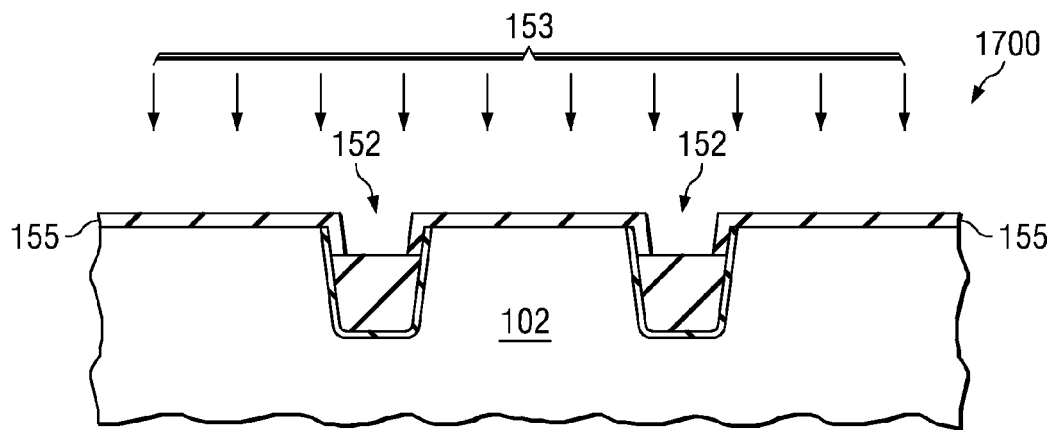
FIG. 17 is a partial side elevation view illustrating the substrate in FIG. 16 following a $V_t$ implant and anneal, according to another embodiment of the present invention.

FIGS. 3-14 and 22-25 refer to exemplary embodiments of fabrication steps of a recessed STI wide transistor involving both process A and process B, as illustrated herein. FIGS. 15-17, refer to exemplary embodiments involving process A, one embodiment of the invention, only. In other words, Process A comprises FIGS. 3-17 and FIGS. 22-25. FIGS. 18-21 refer to exemplary embodiments involving process B only and, therefore, process B comprises FIGS. 3-14 and 18-25.

FIGS. 3-25 describe embodiments of the process steps associated with the fabrication of a recessed STI wide transistor. Although the fabrication process is illustrated and described herein as a series of steps, acts or events, it will be appreciated that the present invention is not limited by the illustrated ordering of such acts or events. For example, some fabrication steps or acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. The fabrication process begins by slicing silicon crystal structures into thin wafers and then adding material or removing material with regard to the wafer, for example, one at a time.

Figure 3:
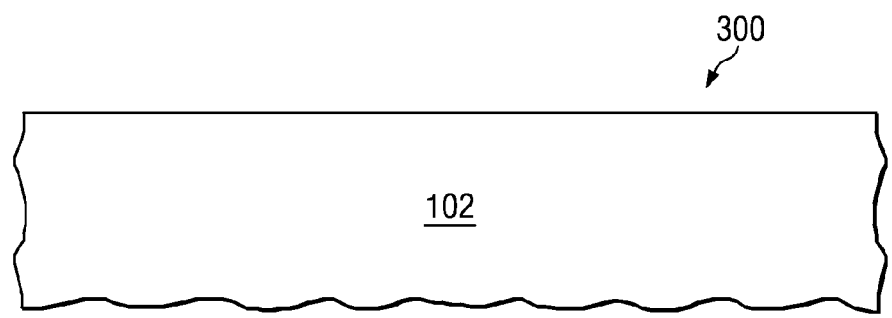
FIG. 3 is a partial side elevation view in section illustrating an exemplary substrate in accordance with an aspect of the present invention.

FIG. 3 illustrates the semiconductor substrate or wafer 102 that is the first building block or component in the overall recessed STI wide transistor 300. The substrate can be, for example, silicon (Si), silicon-germanium (SiGe), and the like. The present process involves etching isolation trenches into the substrate 102 and the resultant trenches at the end of the process are partially filled with an isolation or low-k dielectric material.

Figure 4:
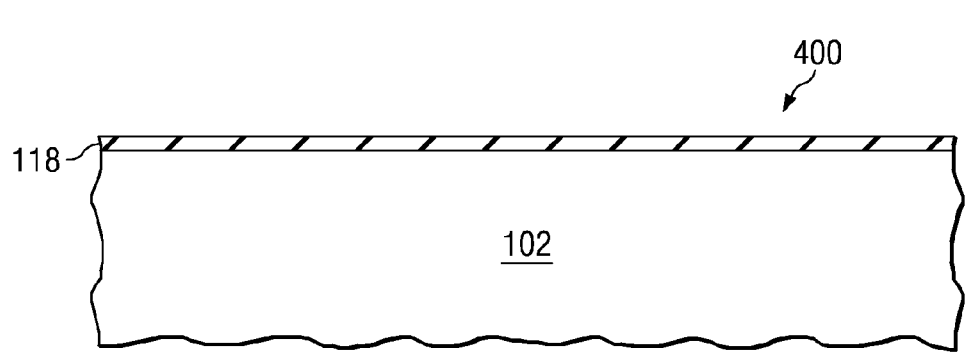
FIG. 4 is a partial side elevation view in section illustrating a thin oxide layer formed over an exemplary substrate processed in accordance with another exemplary embodiment of the present invention.

FIG. 4 illustrates the substrate 102, with a thin layer of dielectric 118 formed on the surface of the substrate 102 (e.g., silicon), obtained by oxidizing (rusting) the substrate 102 outer surface at 400. For example, the thin (about 7-30 nm thick) layer of silicon oxide 118, e.g., silicon dioxide ($SiO_2$), and the like, can be grown in a thermal dielectric processing furnace. The dielectric 118 migrates into the substrate 102 outer surface and is often referred to as a "pad-oxide" 118. The silicon oxide 118 acts, for example, as an intermediate layer or barrier between the silicon substrate 102 and silicon nitride that is deposited on top of the pad oxide 118 in the next processing step.

Figure 5:
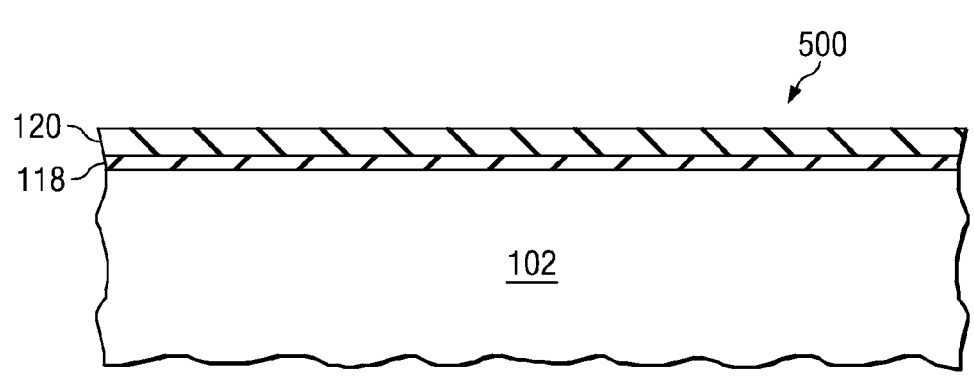
FIG. 5 is a partial side elevation view illustrating a nitride layer formed on top of an exemplary dielectric layer over an exemplary substrate, according to an embodiment of the present invention.

FIG. 5 illustrates a nitride layer 120 (sometimes referred to as an isolation pad nitride) deposited on the surface of the dielectric layer 118 to a thickness of approximately 50-300 nm thick, for example, at 500. The nitride layer 120 may be deposited using several techniques which include deposition by evaporation, sputtering, chemical-vapor deposition (CVD), and the like. In evaporation deposition, a solid material is placed in a vacuum chamber and heated until it evaporates. A portion of hot evaporated molecules condense on the cooler wafer surface to form a solid layer of material on the dielectric surface. The thickness of the nitride layer is determined by the temperature profile of the chamber and the amount of time the substrate is exposed to the evaporation process. Sputtering is a technique that employs positive ions that bombard a cathode, which is coated with the material to be deposited (e.g., the nitride). The bombarded material is removed by direct energy transfer and deposited on the wafer/ dielectric surface which is electrically coupled to an anode. The types of sputtering systems utilized in nitride depositions of integrated circuits include, for example, DC, radio frequency (RF), magnetic, and the like. Chemical vapor deposition (CVD) employs a process in which the nitride layer is deposited by a chemical reaction in a gas phase which occurs adjacent to the silicon wafer. This deposition process is used to deposit, for example, silicon nitride ($Si_3N_4$), and the like. CVD is typically performed at reduced pressures because the diffusivity of the nitride increases significantly, however it can also be performed at atmospheric pressure, for example.

This technique is known by those of ordinary skill in the art as low-pressure chemical-vapor deposition (LPCVD).

The nitride layer 120 can provide protection for an electrical device "active area" formation during shallow trench creation. The nitride layer 120 can be, for example, SiN, silicon nitride ($Si_3N_4$), reaction bonded silicon nitride (RBSN), hot pressed silicon nitride (HPSN), sintered silicon nitrides (SSN), and the like. The dielectric layer 118 and the nitride layer 120 together form what is often referred to as a "hard mask". During pattern transfer to an integrated circuit device, the hard mask layer is consumed during an etching process, for example. However, it is to be appreciated that any hard mask techniques may be practiced in this invention, and that other hard mask materials and masking processes are contemplated as falling within the scope of the invention.

Figure 6:
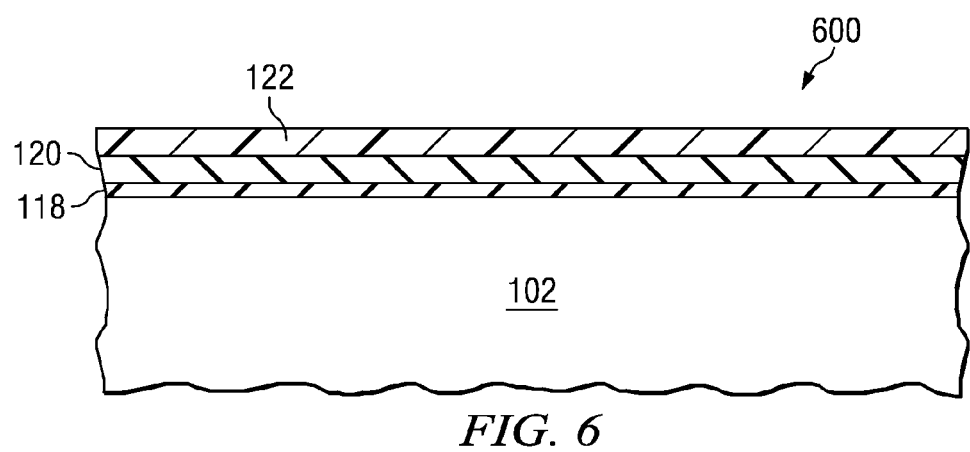
FIG. 6 is a partial side elevation view illustrating a photoresist layer formed on the nitride layer of FIG. 5, according to an exemplary embodiment of the invention.

A conventional photoresist 122 can be applied, as illustrated in FIG. 6 at 600, which, for example, can then be utilized to pattern and etch the nitride layer 120 and the pad oxide layer 118 in order to result in a patterned substrate. The photoresist 122 can be, for example, a solvent-based, light-sensitive resin solution that is uniformly applied, for example, on the nitride layer 120 of the wafer, utilizing a spin type process, and the like. The photoresist 122 can, for example, be a chemical, negative photoresist 122 that hardens when exposed to ultraviolet light or other light wavelengths and the unexposed photoresist 122 can be dissolved by employing a developer solvent, leaving openings in the exposed photoresist 122. Another approach involves utilizing a positive photoresist 122 that is initially insoluble, and when exposed to, e.g., UV, mercury light, laser, x-rays, electron beam, etc., becomes soluble. After exposure, the photoresist 122 can create the etch pattern needed to form STI trenches during, for example, reactive ion etching (RIE).

Figure 7:
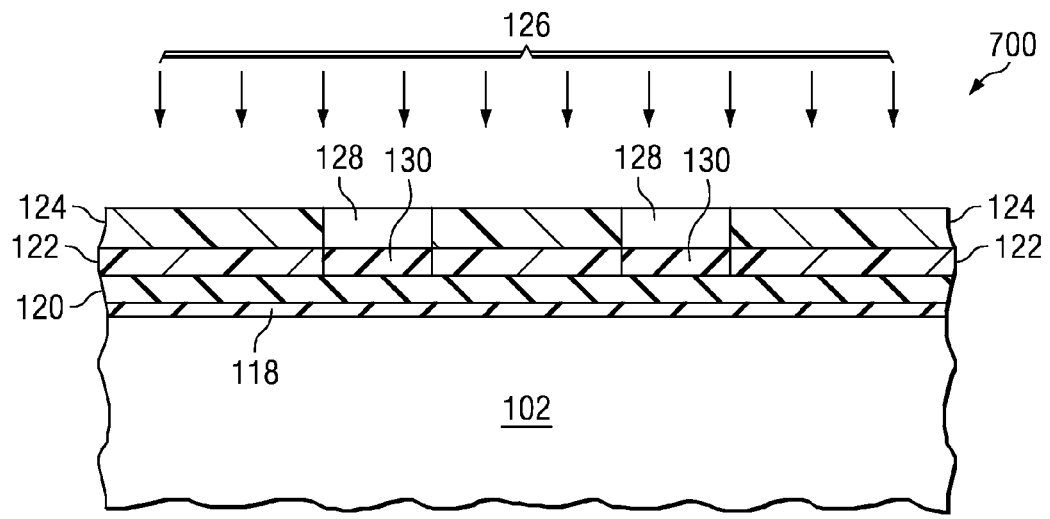
FIG. 7 is partial side elevation view illustrating a photoresist mask placed and aligned over the substrate shown in FIG. 6 and unmasked photoresist regions exposed to ultraviolet light, according to another embodiment of the invention.

FIG. 7 illustrates, for example, exposing the layered substrate to ultraviolet light 126 after the nitride 120 outer surface has been coated with a uniform layer of photoresist 122 and the photoresist 122 has been cured sufficiently, in order to define regions of the device 700. The device 700 can be exposed by employing, for example, the ultraviolet light 126 through a pattern mask opening 128. The mask 124 can be, for example, a glass plate on which an image corresponding to the circuit design is registered. The photoresist 122 can be positive photoresist, negative photoresist, or both. Depending on the type of the photoresist 122 either the image or non-image portion of the photoresist 130 can be removed in a photoresist developer. Utilizing positive photoresist 122 in FIG. 7 can result in exposed photoresist 130 softening which can then be washed away utilizing a developing solution, for example.

Figure 8:
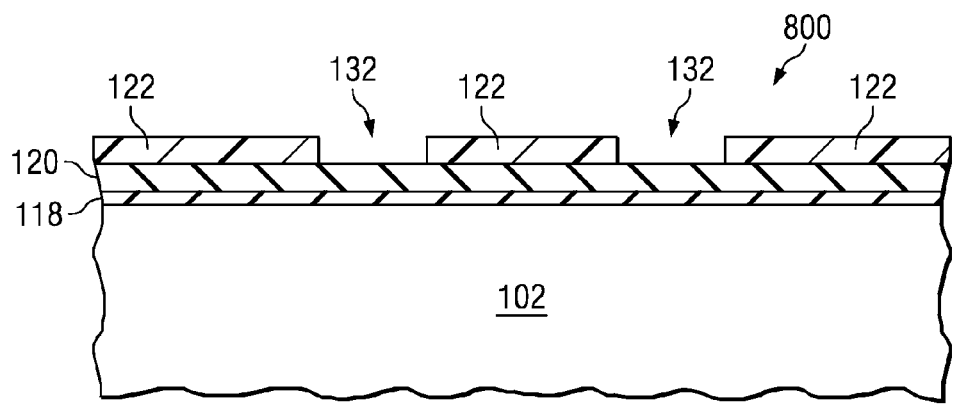
FIG. 8 is a partial side elevation view illustrating the photoresist on the substrate of FIG. 7 developed according to another embodiment of the present invention.

FIG. 8 illustrates a wafer 102 after exposed photoresist, for example, has been removed in the selected regions, at 800. Remaining photoresist 122 has two basic functions; the first function is precise pattern formation and the second function is to provide protection for the device 800 from chemical attack during subsequent etch processes. The photoactive ingredient of the photoresist 122 allows the pattern to be formed after the unwanted portions of the uniformly distributed photoresist have been removed. The development process involves chemical reactions wherein unprotected or developed resist 132 has been dissolved away in a development process. Development can be carried out, for example, by immersion developing, spray developing, puddle developing, and the like.

Figure 9:
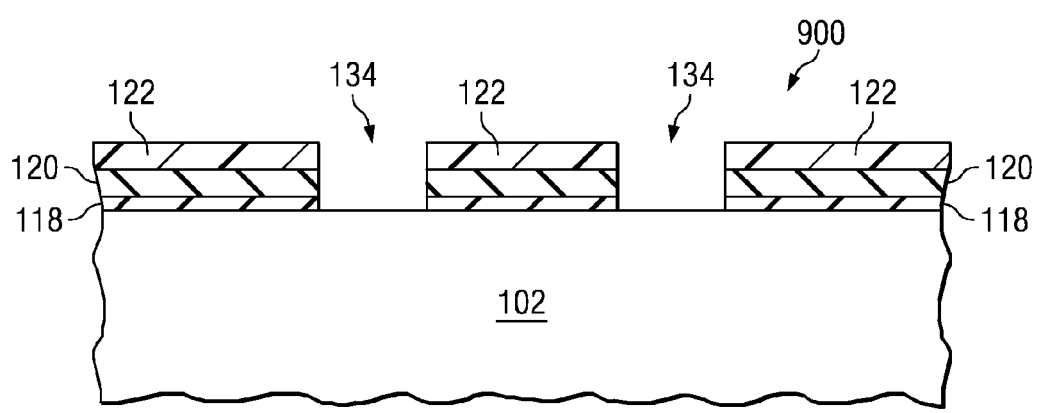
FIG. 9 is a partial side elevation view illustrating the substrate in FIG. 8 with the oxide and nitride layers etched away, according to another embodiment of the present invention.

Next, as represented at 900 in FIG. 9, a plasma etching process can be performed to remove the nitride layer 120 and the dielectric layer 118 (oxide pad) in pre-isolation regions 134. The pre-isolation regions 134 can be formed in those areas where the photoresist was removed in the previous process or fabrication step. The pre-isolation areas 134 are the areas wherein the trenches can be formed employing a known etch process or technique.

Figure 10:
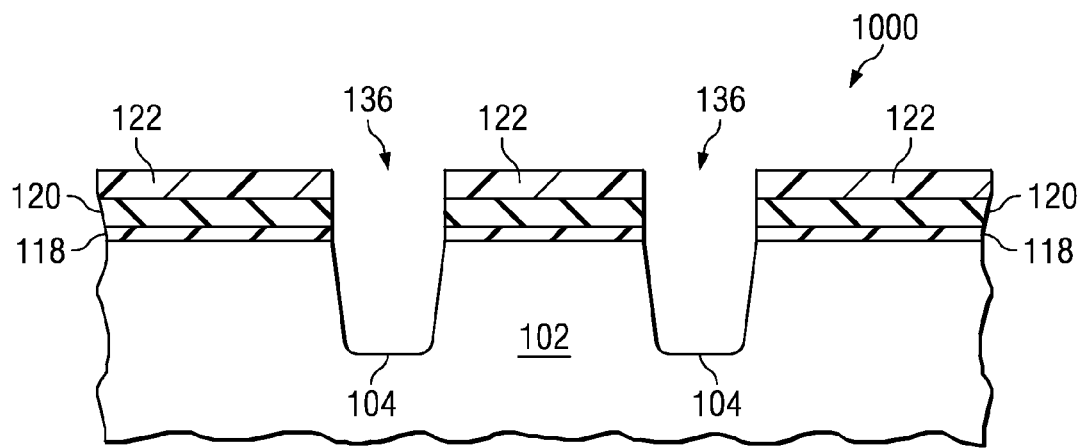
FIG. 10 is a partial side elevation view illustrating the substrate in FIG. 9 with a silicon trench etched into the substrate, according to another embodiment of the present invention.

A silicon substrate 102 as illustrated in FIG. 10 at 1000 can be etched to form an isolation trench 104 for shallow trench isolation (STI). The isolation trenches 104 are formed to separate the various electronic devices from each other by creating the trenches 104 in non-active regions 136 of the substrate 102. By selectively masking the active regions of the wafer with photoresist 122 and leaving the non-active or isolation regions 136 exposed the etchant can create trenches 104 in a designed fashion. The etching procedure may be, for example, a single step or multi-step process, a wet or dry etch process, by which material is removed in the exposed isolation regions in the semiconductor substrate 102 to form the isolation trenches 104. For instance, a first plasma etch step may be employed at 136 to eliminate the majority of the silicon wafer trench 104 material, before a second dry etch step is performed to etch away the remainder of the silicon trench 104 material at the openings in the photoresist mask 122, creating the example isolation trenches 104. Any appropriate single or multi-step trench creation process, known by those of ordinary skill in the art, may be employed at 136 in accordance with the present invention.

Figure 11:
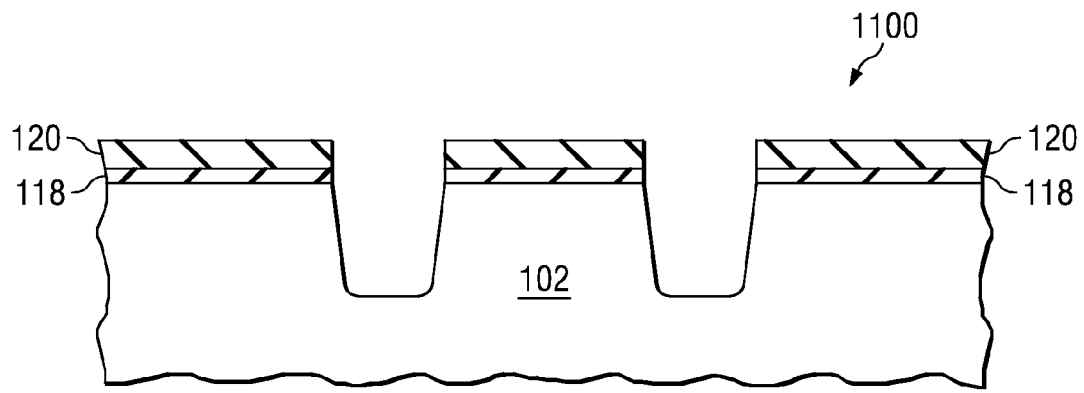
FIG. 11 is a partial side elevation view illustrating the substrate in FIG. 10 with the photoresist removed, according to another embodiment of the present invention.
Figure 12:
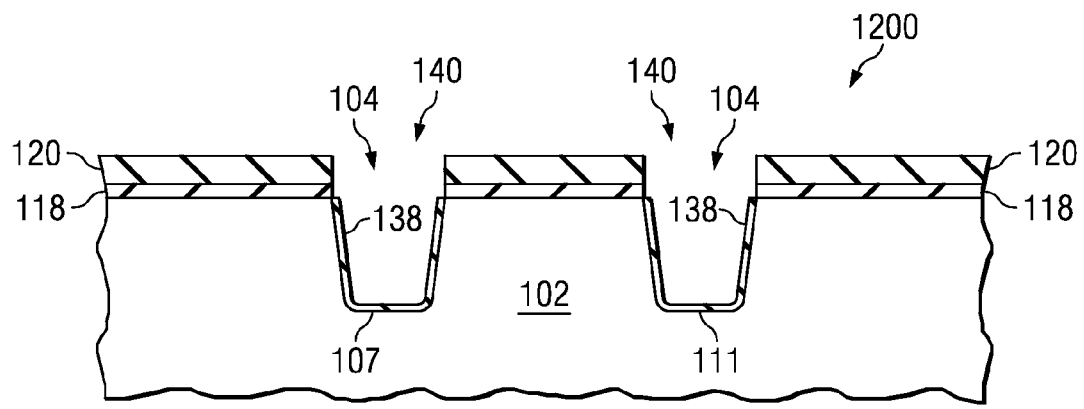
FIG. 12 is a partial side elevation view illustrating the substrate in FIG. 11 with a protective oxide, later formed in the trench, according to another embodiment of the invention.

As illustrated in FIG. 11 a photoresist removal process can be executed at 1100. The photoresist can be removed by employing any known photolytic process or any other process that can be employed to create a pattern mask on an IC device. FIG. 12 illustrates at 1200 the creation of a dielectric trench liner 138 formed over the exposed portions of the trench 104 within a substrate 102. The dielectric trench liner 138 can be formed to a thickness of about 3-20 nanometers, for example. The dielectric trench liner 138 can be formed in any appropriate manner, such as, for example, a thermal dielectric growth process 140 at the exposed trench surfaces, including sidewall recesses 107 and a center space 111 of the etched trench 104. The trench dielectric liner 138 can be employed, for example, to round the corners at the bottom of the trench, to act as a protective layer at the bottom of trench (protects the silicon from damage), to act as a high purity spacer between the silicon and the fill dielectric, and the like. The remaining dielectric pad 118 and nitride layer 120 can prevent oxidation in the active regions when the trench dielectric liner 138 is grown in the exposed trench 104 of the isolation regions. The trench lining process can be, for example, a thermal process, an LVCVD process, a thermal process bi-layered liner, a chemical oxide process in combination with LPCVD film processes, and the like. However, it should be apparent to those of ordinary skill in the art that other trench liner materials (e.g., nitride), multiple isolation liners, no liners at all, and the like are contemplated with this invention.

Figure 13:
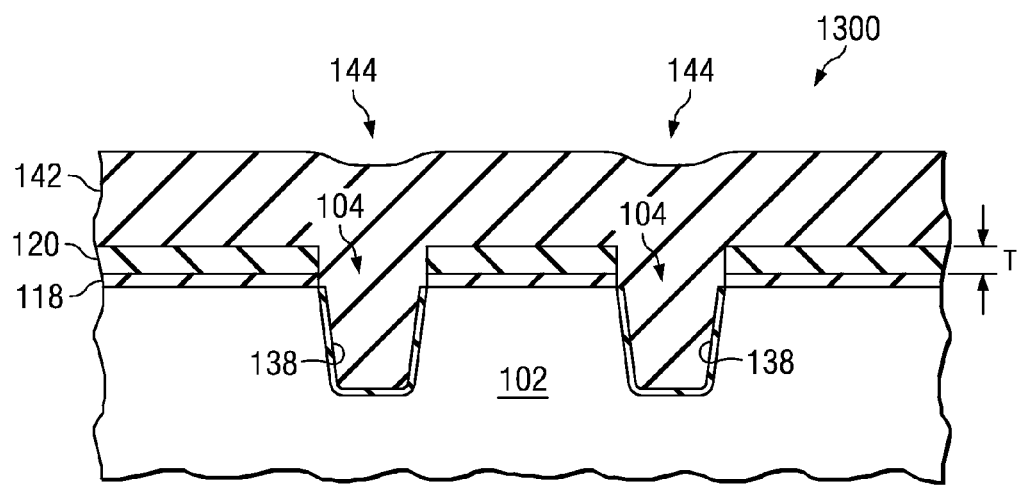
FIG. 13 is a partial side elevation view illustrating the substrate in FIG. 12, where a STI trench is filled with isolation material, according to an exemplary embodiment of the invention.

Illustrated in FIG. 13 at 1300, are isolation trenches 104 that can be filled with isolation material 142 by employing a vapor deposition process 144, for example. The isolation material 142 can be deposited to a thickness about 100-400 nanometers, for example. The isolation trench 104 deposition process 144 at 1300 may be performed, for example, using any appropriate deposition process, such as high density plasma chemical vapor deposition (HDPCVD) of silicon oxide ($SiO_2$), low pressure chemical vapor deposition (LPCVD), tetraethyl-orthosilicate (TEOS) deposition, plasma enhanced chemical vapor deposition (PECVD), and the like. However, it is to be appreciated that any deposition method or process may be employed at 144, and that other fill materials and fill processes are contemplated as falling within the scope of the invention. HDPCVD, for example, is a selfplanarizing process which facilitates reduction of the chemical mechanical polishing (CMP) time required in subsequent steps, for example. The deposition process 144 fills the trenches at 104 and covers both dielectric 118 and nitride 120 layer. At this point in the process the nitride layer has a thickness of T.

Figure 14:
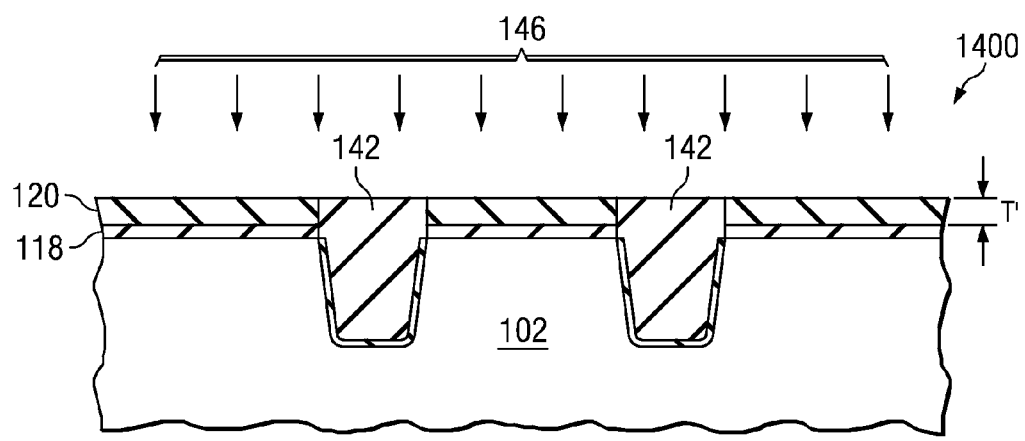
FIG. 14 is a partial side elevation view illustrating the substrate in FIG. 13 following a chemical mechanical polishing process, according to another embodiment of the present invention.

As illustrated in FIG. 14 at 1400, following the deposition of a dielectric isolation material 142, the isolation material 142, for example, can be polished at 1400 via chemical mechanical polishing (CMP) 146 into the surface of a nitride layer 120 as shown. Since the CMP 146 process is not a self-stopping process, the nitride layer 120 thickness can be increased beyond a given thickness in order to provide process margin for CMP 146. This helps to prevent CMP 146 overpolishing from damaging the underlying substrate and accordingly, the nitride layer 120 thickness is reduced from T (as shown in FIG. 13) to T' revealing the nitride layer 120 surface and the remaining trench isolation material 142 in the isolation trenches 104. The upper surface of the trench isolation material 142 is subsequently even with the exposed upper or top surface of the nitride layer 120.

Referring now to FIGS. 15-17, these FIGS., as mentioned supra, refer to layer 120. an embodiment of the present invention involving process A, an embodiment of the invention. Process A comprises FIGS. 1-17 and FIGS. 22-25.

Illustrated in FIG. 15 is an embodiment of the present invention involving process A, recessing the STI trench 147 and a deglazing 148 process step that can be executed at 1500. After STI chemical mechanical polishing (CMP) has been completed employing, for example, linear planarization technology (LPT), the deglaze process 148 is initiated. CMP is inherently an "unclean" process with regard to the substrate and ensuing device. Defect minimization after the CMP process can be of critical importance to the overall success of manufacturing STI devices. Defects created during the CMP process can be classified as, for example, particulate, metallic, organic, and the like. The wet etch process 148, typically hydrofluoric acid (HF),can be executed prior to the isolation nitride 120 removal. Nevertheless, it is contemplated that the concepts of the present invention may be utilized with other deglazing process steps, for example, a deglaze process step immediately before gate oxidation, without departing from the spirit and the scope of the invention FIG. 16 represents an embodiment of the present invention with regard to process A, at 1600, illustrating an isolation nitride removal 150 with a phosphoric acid at elevated temperature and SC1 megasonic. An optional hot, "standard clean 1" (SC1) cleaning employing HF and hydrogen peroxide ($H_2O_2$) can be utilized employing a vapor dry process 151. SC1 is defined as a cleaning bath in an industrial standard cleaning sequence, that can consist of ammonium hydroxide ($NH_4OH$), hydrogen peroxide ($H_2O_2$) and water ($H_2O$) solution designed to remove particles and/or contaminants from a substrate 102 surface. The SC1 process is widely used in the semiconductor industry for many wet-chemical cleaning processes. A subsequent HF clean can be utilized to reduce dielectric defect failures, for example. A $V_t$ implant 153 is carried out in FIG. 17 at 1700 according to an embodiment of process A along with an annealing process. $V_t$ implantation and annealing techniques are widely known in the current art by those of ordinary skill.

Referring now to FIGS. 18-21, these figures, as mentioned supra, refer to a second process B, an additional embodiment of the present invention. The entire Process B comprises FIGS. 3-14 and FIGS. 18-25.

Figure 18:
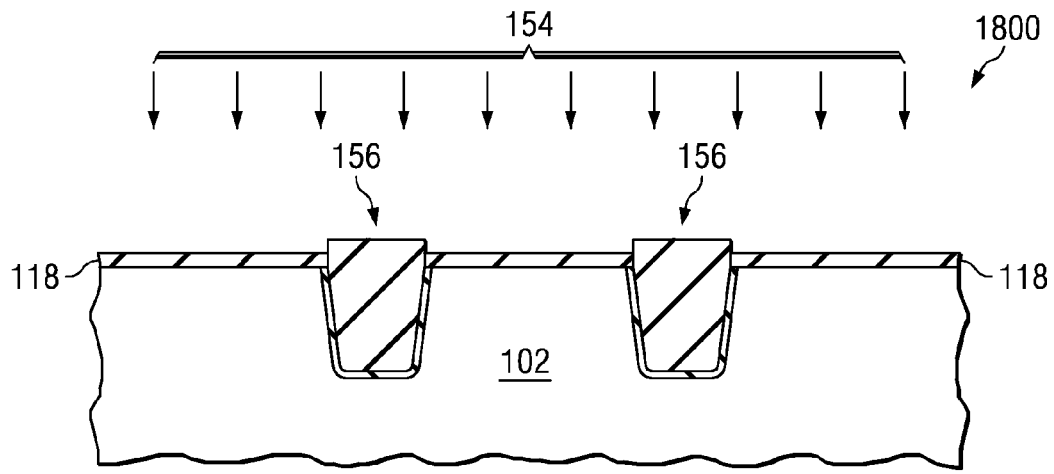
FIG. 18 is a partial side elevation view illustrating the substrate in FIG. 17 with a nitride layer stripped away, according to another embodiment of the present invention.
Figure 19:
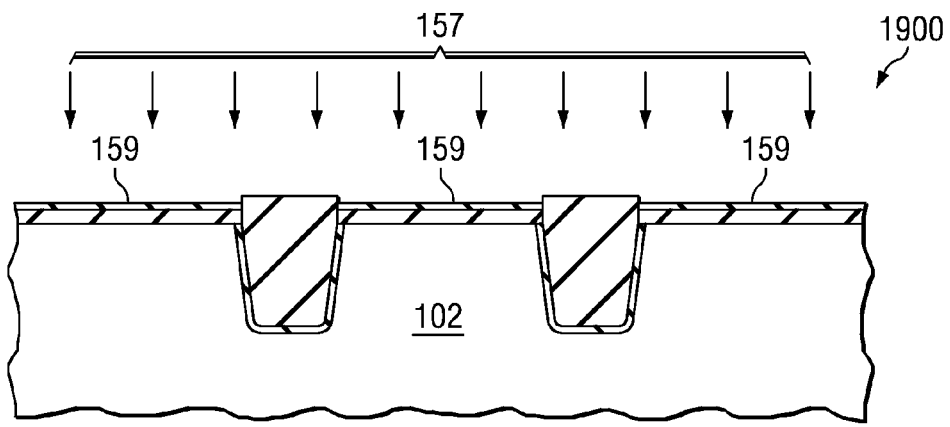
FIG. 19 is a partial side elevation view illustrating the substrate in FIG. 18, according to another embodiment of the present invention.

In FIG. 18, at 1800, continuing from FIG. 14 the nitride layer 120 is stripped away 154 leaving a pad oxide 118 in place. The process step, for example leaves a raised isolation material 156. At 19, the pad oxide 118 is stripped away 157 using an oxide etch stripping process 157 at 1900. A new sacrificial oxide 159, for example can be grown on the substrate 102.

Figure 20:
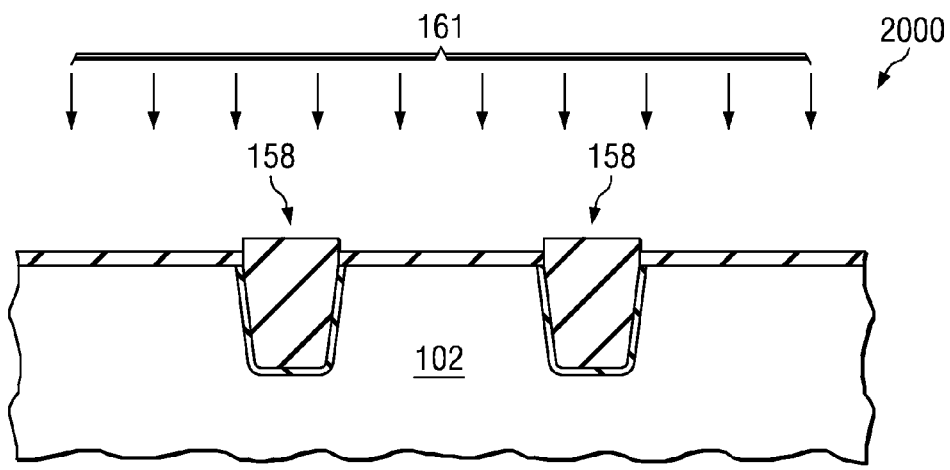
FIG. 20 is a partial side elevation view illustrating the substrate of FIG. 19 illustrating a $V_t$ implant and anneal, according to another embodiment of the present invention.

At process step 2000 of FIG. 20, an embodiment of Process B of the present invention, can involve a $V_t$ implant 161 and a high temperature repair anneal 158 to compensate for crystalline damage in the substrate, for example, $V_t$ damage. The ion implantation process 161 inherently produces damage in the silicon substrate 102 and it is therefore necessary to follow up the implantation process 161 with a high temperature, annealing process 158. The annealing process 158 is a physical transformation (e.g., as opposed to a chemical reaction) of an IC device induced by the application of thermal energy. The annealing process 158 repairs or corrects most of the silicon damage and produces high dopant activation fractions.

Figure 21:
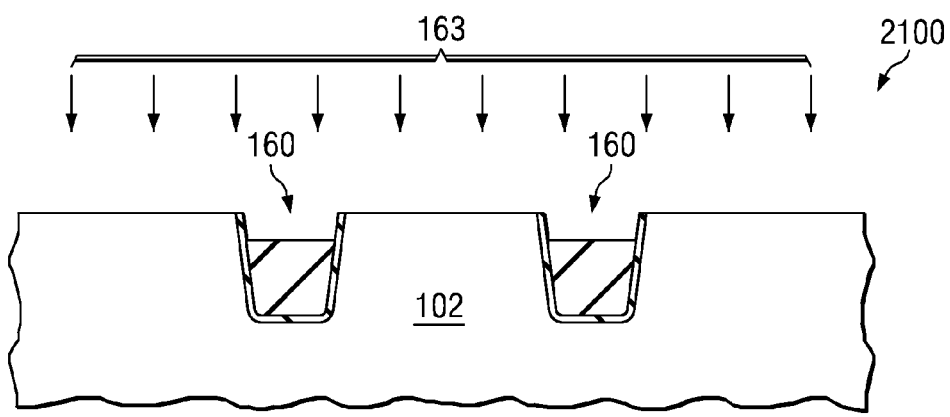
FIG. 21 is a partial side elevation view illustrating the substrate in FIG. 20 following a pre-furnace clean and subsequent vapor dry process, according to another embodiment of the present invention.

FIG. 21 illustrates a hot standard clean 1 (SC1) 163, HF, SC2 and vapor dry process 2100 that is employed as a fabrication step in process B to create an STI recessed wide transistor. Standard Clean 1 (SC1) 163 can be the first half of an RCA clean sequence, and is used primarily to remove organic materials that would block the subsequent wet etching (e.g., HF) or deglazing process. The wet etching or deglaze of the oxide is performed to create the STI recess.

Figure 22:
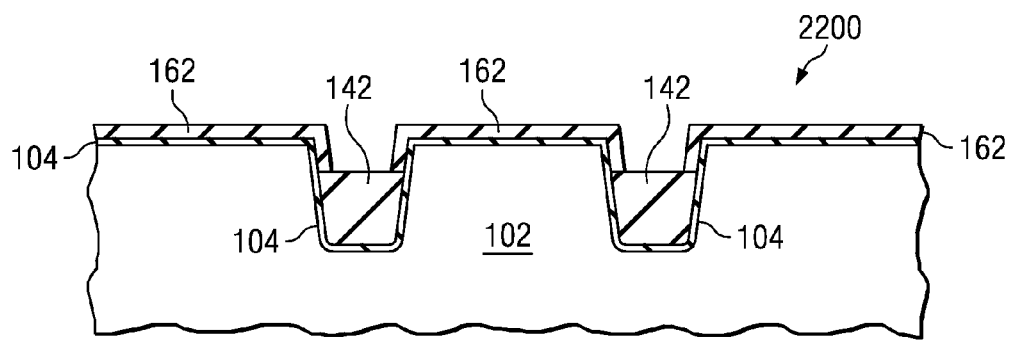
FIG. 22 is a partial side elevation view illustrating the substrate in FIG. 21 with a high voltage gate oxide deposition process, according to another embodiment of the present invention.
Figure 23:
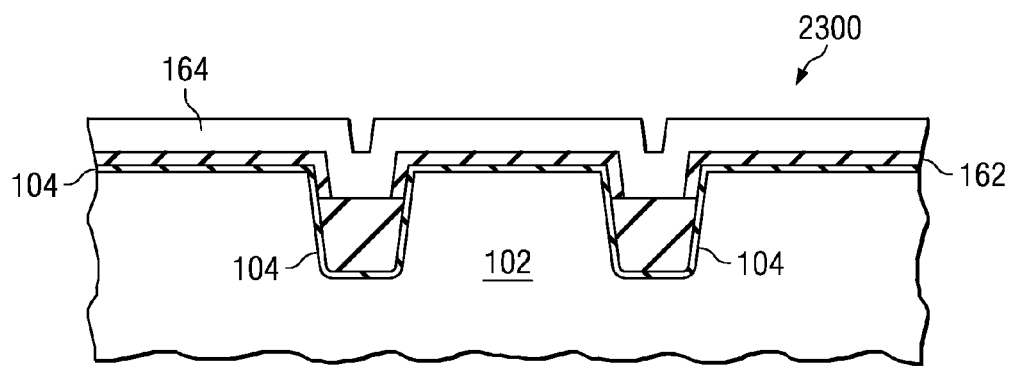
FIG. 23 is a partial side elevation view illustrating the substrate assembly in FIG. 22 with an HDP polysilicon deposited on the substrate assembly, according to another embodiment of the present invention.

Referring to FIGS. 22-25, these FIGS. refer to both Process A and Process B. FIG. 22 illustrates at 2200 another embodiment of the present invention, a high voltage gate oxide deposition process. The high voltage oxide layer 162 can be applied on top of the substrate surface 102. High voltage devices such as those used in wide transistor applications, for example, switches, require a layer of gate oxide to protect the device against high voltage breakdown, A polysilicon deposition process is illustrated in FIG. 23 at 2300. A gate oxide layer 162 is formed and is covered by a gate electrode material, for example, a polysilicon layer 164. The polysilicon layer can be, for example, be deposited employing, HDP, LPCVD, RTCVD, PECVD, and the like.

Figure 24:
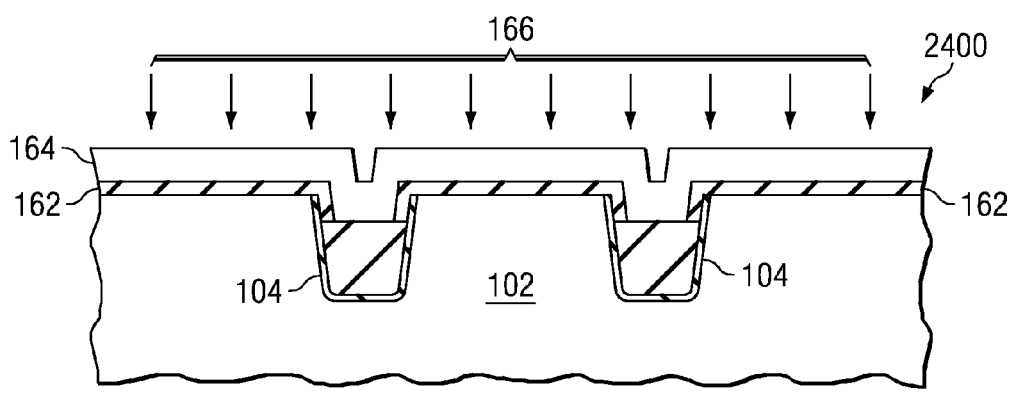
FIG. 24 is a partial side elevation view illustrating the substrate of FIG. 23 during gate patterning and plasma etch, according to another embodiment of the present invention.
Figure 25:
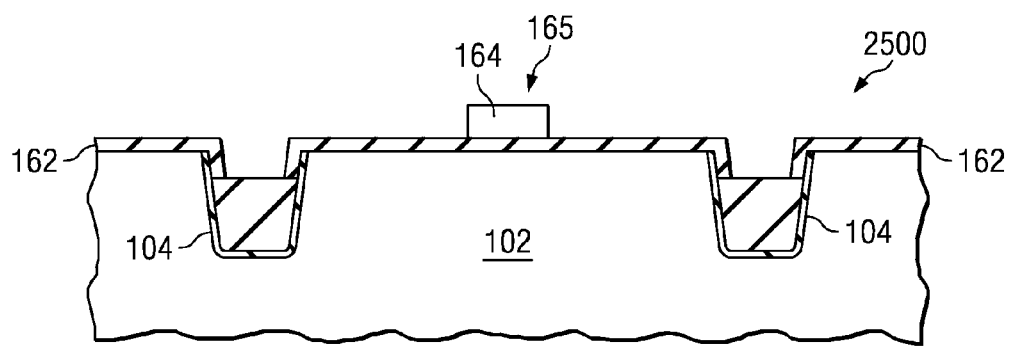
FIG. 25 is a partial side elevation view illustrating the substrate in FIG. 24 rotated 90 degrees following a plasma etch process, according to another embodiment of the present invention.

FIG. 24 illustrates a gate pattern and plasma etch 166 at 2400. The substrate 102 polysilicon 162 is patterned with, for example a photoresist that can be reactive ion etched (RIE) in $O_2$. The vertical etch rate of the resist (not shown) can be varied linearly with, for example etch time, plasma power, and the like. The gate pattern and plasma etch 166 can be performed in both process A and process B. FIG. 25 illustrates an aspect of the substrate, illustrated in FIG. 24 rotated 90 degrees at 2500. The patterned gate stack 165 is illustrated formed upon a dielectric layer 162, for example. The patterned gate stack 165 is comprised of a polysilicon electrode 164 on top of a dielectric layer 162.

Figure 26:
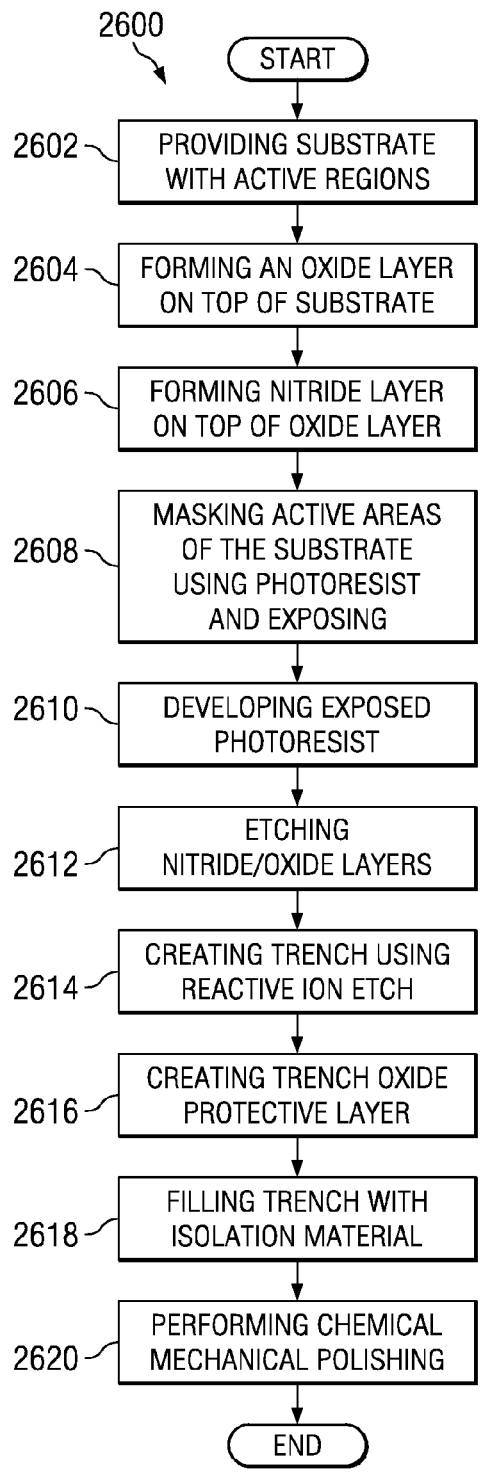
FIG. 26 is a flow diagram illustrating an exemplary method of fabricating isolation structures in a semiconductor substrate according to another aspect of the present invention.

Referring to FIG. 26, an exemplary method 2600, is illustrated for fabricating an isolation trench in a substrate in accordance with one or more aspects of the present invention. It will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. In one example, the method 2600 or variants thereof, may be used in manufacturing recessed STI wide transistors, as illustrated and described above with respect to FIGS. 3-11.

Beginning at 2602 of FIG. 26, a substrate is provided with active regions created per ion implantation at 2600. It will be appreciated that the implantation process can take place at various steps along the process as is well known to those of ordinary skill in the art. At 2604 an oxide layer is formed over the substrate utilizing a thermal oxide process. Any appropriate process steps and materials can be employed in the formation of the oxide layer at 2604, including oxidation processes as are well known to those of ordinary skill in the art.

At 2606 a nitride layer is formed over the oxide layer at 2604. Known deposition processes by those of ordinary skill in the art can be employed in the formation of the nitride layer at 2606. The nitride layer, as discussed in FIG. 5 above can be, for example, silicon nitride, reaction bonded silicon nitride, hot pressed silicon nitride, sintered silicon nitrides, and the like. At 2608 active areas of substrate are coated with a photoresist and subsequently exposed to light through openings in a photoresist mask, for example. As described in FIGS. 6, supra, the photoresist can be, for example, a solvent-based, light sensitive resin solution that softens or becomes soluble when exposed to light (positive photoresist). Any appropriate process steps, materials or energy may be utilized in forming the photolytic mask and exposing the photoresist.

The methodology continues at 2610, where a soluble photoresist (exposed or un-exposed), for example is developed or etched away exposing the outer surface of the nitride layer at 2606. The process step at 2610 results in a pattern being formed on the substrate allowing for trench formation. At 2612 a nitride layer and oxide layer etching process can be performed. As disclosed in FIG. 9, the pre-isolation regions can be formed in those areas where the photoresist was removed at 2610. Any suitable fabrication steps or materials can be employed in etching the oxide and nitride layers as are known, for example, wet etching techniques, or dry etching techniques, or both.

At 2614 a trench can be created in the substrate to provide isolation regions that can subsequently be filled with a dielectric material. As discussed in FIG. 10, the etching procedure may be, for example, a single step or multi-step process, a wet or dry etch process, by which material is removed in the exposed isolation regions in the semiconductor substrate to form the isolation trenches.

The exemplary method 2600 continues at 2616, for example, with the deposition of a dielectric trench liner that can be formed over the exposed portions of the STI trench. The trench dielectric liner can be deposited or formed in any suitable process step, such as a thermal growth process at the exposed trench surfaces, including sidewall recesses and center section of the etched STI trench. As discussed supra, the trench dielectric liner can be deposited to act as a protective layer at the bottom of trench, to act as a high purity spacer between the silicon and the fill dielectric, and the like. The trench lining process can be, for example, a thermal process, an LVCVD process, a thermal process bi-layered liner, a chemical oxide process in combination with LPCVD films, and the like. It should be apparent to those of ordinary skill in the art that other trench liner materials (e.g., nitride), multiple isolation liners, no liners at all, and the like are contemplated with this invention.

At 2618 the entire exposed surface of the substrate assembly can be covered with a trench filling isolation material. The isolation material, for example, can be high density plasma (HDP) oxide that covers the remaining nitride and oxide layers, as well as, overfilling the trenches. The isolation trench deposition process can be performed, for example, using any appropriate deposition process, such as high density plasma chemical vapor deposition (HDPCVD) of silicon oxide ($SiO_2$), low pressure chemical vapor deposition (LPCVD), tetraethyl-orthosilicate (TEOS) deposition process, plasma enhanced chemical vapor deposition (PECVD), and the like.

The exemplary method 2600 continues at 2620, for example, with an optional chemical mechanical polishing (CMP). After CMP, for example, the upper surface of the trench isolation material is subsequently even with the exposed upper or top surface of the nitride layer. It should be appreciated that any process known by those of ordinary skill in the art to create a planar STI structure such that electrical devices (inner active areas) can be formed within regions bounded by the STI is contemplated with this invention.

The exemplary method 2600 ends at 2620, after which further process steps (not shown) may be performed to fabricate peripheral devices in the periphery of the wafer, followed by metallization and other back end processing. Alternatively, some or all of the peripheral device processing may be carried out in parallel with processing of the recessed STI wide transistors in accordance with the exemplary method 2600 and other methods of the invention.

Figure 27:
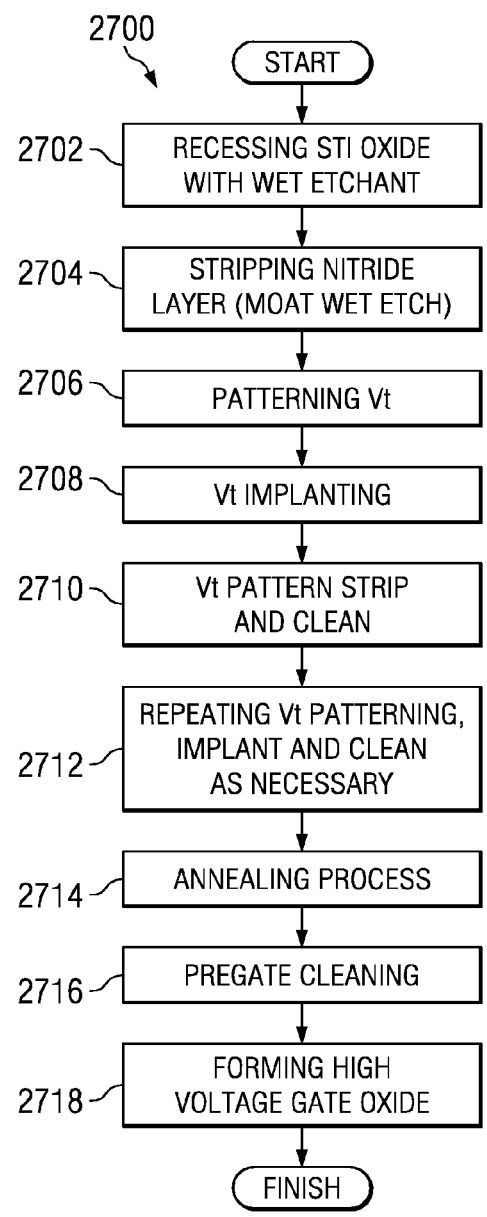
FIG. 27 is another flow diagram illustrating yet another exemplary method of fabricating isolation structures in a semiconductor substrate according to another aspect of the present invention.

Beginning at 2700 of FIG. 27, shallow trench isolation (STI) trenches have already been formed and filled in exemplary method 2600, and the STI at 2702 can be recessed utilizing, for example a wet etchant, dry etchant and the like. The etchant removes a portion of the isolation material in the trench to form the recessed STI, for example, for wide transistors in order to increase the drive current ($I_{on}$) of the transistors, wherein the leakage current ($I_{off}$) remains relatively constant. The recessed trench can be employed to increase the effective width of the active area for a given transistor spatial footprint, at the existing lithographic limits or technology node. The resultant structure forms a non-planar active area in which the transistor is subsequently fabricated. The physical gate width of the transistor built on such a recessed STI device can be increased without a concurrent increase in the width of the active area. At process step 2704, the nitride can be stripped by employing stripping techniques known by those of ordinary skill in the art. The isolation nitride, for example, can be removed with phosphoric acid at elevated temperature and SC1 megasonic processing.

The exemplary method 2700 continues at 2706, an implant layer can be patterned on a substrate with, for example, high topography and high reflectivity forming a patterned layer over the silicon layer; forming doped inhibiting regions within the substrate. Any suitable patterning steps or patterning materials can be employed in patterning the substrate as are known, for example, by those of ordinary skill in the art.

At 2708, the device is implanted with ion species through the patterned layer to define an implant pattern. A $V_t$ implantation process can then be carried out along with an annealing/repair process, for example. The $V_t$ implantation techniques are widely known in the current art by those of ordinary skill.

The exemplary method 2700 continues at 2710, wherein the $V_t$ pattern is stripped and cleaned utilizing processes known by those of ordinary skill in the art, for example, a hot "standard clean 1" (SC1) cleaning employing HF and hydrogen peroxide ($H_2O_2$) utilizing a vapor dry process as described in FIG. 16. In addition, for example, a subsequent HF clean can be utilized to reduce oxide defect failures. At step 2712, process steps 2706, 2708 and 2710 are repeated as necessary to obtain an acceptable implanted substrate. At 2714, an annealing process can be performed on the substrate assembly to repair damage caused during ion implantation necessary to create the device active areas, for example. At 2716, a pre-gate or pre-furnace formation cleaning step can be executed, for example utilizing SC1, HF and SC2 (HC1, $H_2O_2$, and DI water). The wet etching process at 2716 can be carried out using various chemicals, e.g., ammonia, ammonium hydroxide, hydrofluoric acid, hydrochloric acid, and the like.

At 2718 a high voltage oxide is deposited on the outer surface of the substrate and the recessed trenches. As discussed supra, high voltage devices such as those often used in wide transistor applications, for example, switches, require a layer of gate oxide to protect the device against high voltage breakdown, after process step 2718, the process finishes.

Figure 28:
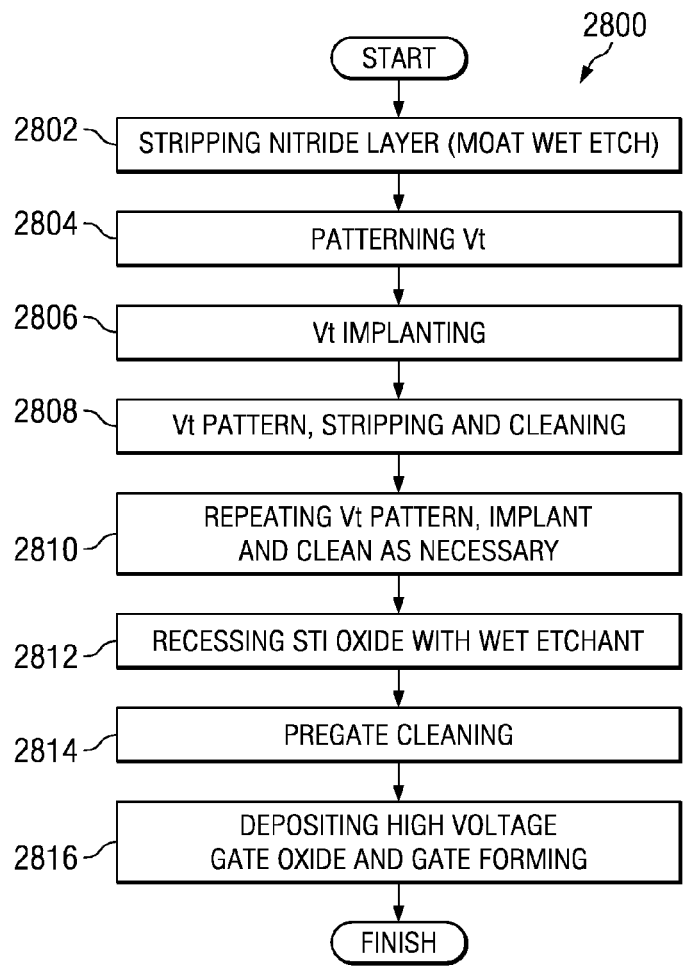
FIG. 28 depicts yet another flow diagram illustrating an exemplary method of fabricating a semiconductor substrate according to another aspect of the present invention.

Beginning at 2800 of FIG. 28, shallow trench isolation (STI) trenches have been formed previously at 2600, and the nitride layer can be stripped at 2802 using a moat wet etch, a plasma etch, and the like, for example. The etching techniques are widely known by those of ordinary skill in the art. The substrate at 2804 can be patterned for the $V_t$ implantation process to take place at 2806, for example. At 2804, the implant layer can be patterned on the substrate with, for example, high topography and high reflectivity forming a patterned layer over the silicon layer; forming doped inhibiting regions within the substrate. Any suitable patterning steps or patterning materials can be employed in patterning the substrate as are known, for example. At 2806, the device is implanted with ion species through the patterned layer to define an implant pattern. At 2808 the $V_t$ pattern is stripped and cleaned utilizing processes known by those of ordinary skill in the art, for example, a plasma ashing process, an SPM (sulfuric hydrogen peroxide mixture) process, and the like. In addition process step 2808 can be, for example, a hot SC1 plus HF plus SC2 followed by, for example, an IPA vapor dry process as described in FIG. 15. The wafer drying process can be a spin dry, an IPA vapor dry, a surface tension gradient dry, a low pressure dry, a supercritical $CO_2$ ($SCCO_2$), and the like. At step 2810 process steps 2804, 2806 and 2808 are repeated as necessary to obtain a desired implanted substrate. The STI can be recessed at 2812 utilizing a wet etchant, a plasma etch, and the like, for example.

At 2814 a hot "standard clean 1" (SC1) cleaning can be employed with HF and hydrogen peroxide ($H_2O_2$) utilizing a vapor dry process as described in FIG. 15, for example. A subsequent HF clean, for example, can be utilized to reduce oxide defect failures. A vapor dry process can be employed, at 2814, as another aspect of the invention.

At 2816 a high voltage oxide (HVO) is grown or deposited on the outer surface of the substrate. If the HVO is deposited, it will also cover the top surface of the recessed trenches. As discussed supra, high voltage devices such as those often used in wide transistor applications, for example, switches, require a layer of gate oxide to protect the device against high voltage breakdown. Polysilicon gates are formed on the substrate (e.g., doped polysilicon), using chemical vapor deposition (CVD) processes as are known by those of ordinary skill in the art.

FIGS. 29-31 show the tabulated results of a geometrical approach to calculating the increase in drive current for a sawtooth, segmented active region generated by the recessed STI. The approach taken in FIGS. 29, 30 and 31 is the same, however the tables are for 1, 5 and 10 micron active width, respectively. In other words, FIGS. 29, 30, and 31 were obtained utilizing a 1, 5, and 10 micron active width footprint on the top of the silicon surface.

FIG. 29 is a graph illustrating the geometry based upon a 70 micron shallow trench isolation (STI) width, with a 60 micron recess depth. Note that the STI trench is partially filled with a dielectric, so it subtracts 70microns times the number of recessed STI trenches from the original active width segment (illustrated at 2908). Considering the serpentine or sawtooth effect of the recessed STI trenches, the width of each remaining active segment is illustrated at 2910. The number of vertical gates is equal to two times the number of recessed STI trenches plus one (=2×(number of STI trenches+1)), as shown at 2912. The "plus one" accounts for the recess also obtained at the ends of the original wide active area. The STI recess depth translates into a geometrical gain of (2*60)/70per recess, as shown. This value was then multiplied by the electrical efficiency of the vertical gates, assumed to be (from data obtained) 0.7 (i.e., vertical gates are about 70% as efficient as horizontal gates), in providing drive current. This has to do, in part, with the subsequent doping of the vertical vs. horizontal surfaces. As illustrated at 2918, this is the net gate width Wg considering the segmented active area plus the vertical gates multiplied by the electrical efficiency. 2920 illustrates the Idrive increase of the sawtooth or serpentine patterned segment active area vs. the original footprint (without an STI recess), for example.

Referring to FIGS. 30 and 31, in one embodiment of the present invention, the calculations discussed supra in FIG. 29 were repeated for 5 and 10micron footprint active gate width Wg, respectively.

Figure 32:
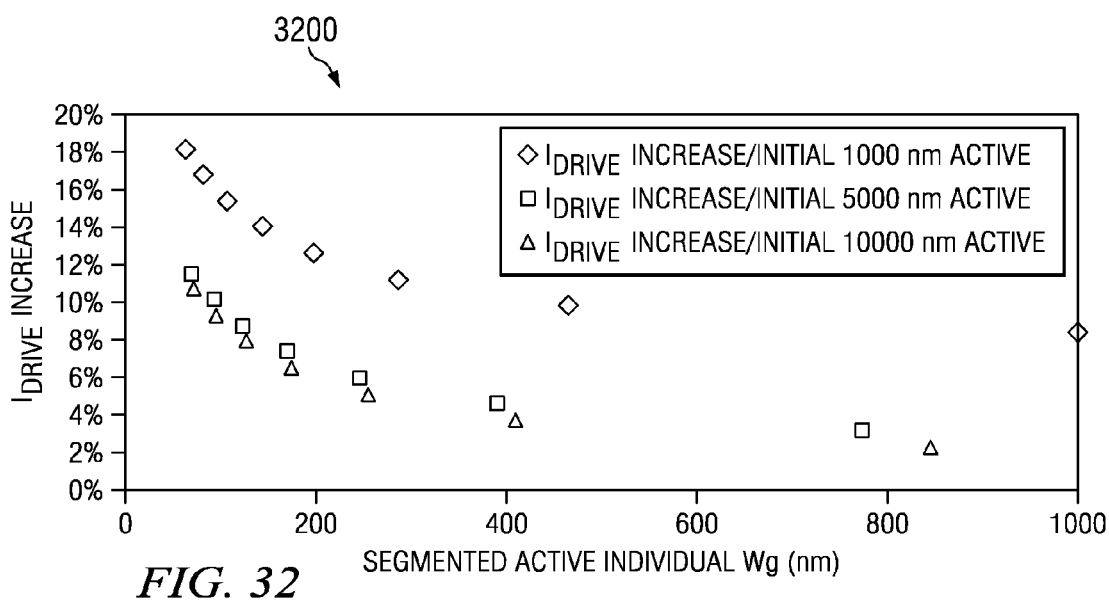
FIG. 32 is a graphical representation showing exemplary improvements of the present invention, according to the present invention.

FIG. 32 summarizes the results of FIGS. 29-31, presented in terms of Idrive (drive current) increase vs. the Wg (gate width) of the individual segmented active areas obtained by the recessed STI processing. The x-axis variable was selected to highlight that, as the individual STI segments get less wide, the Idrive increase becomes more significant. FIG. 32 illustrates that depending on the footprint of the original planar transistor (1-10 microns), an Idrive increase of about 5-50% is possible with the application of the recessed STI. It should be apparent to those of ordinary skill in the art that this approach of using a recessed STI results in a very significant Idrive increase over the current art.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for fabricating a recessed STI wide transistor, comprising:
   providing a substrate with active regions of a first conductivity type,
   forming a first oxide layer on the substrate;
   forming a nitride layer on the first oxide layer;

employing a photolithographic process to pattern and etch the first oxide and nitride layers to create isolation trenches extending in a first direction;

filling the isolation trenches partially by providing insulative material in a bottom portion of the isolation trenches; thereby establishing recessed isolation trenches defining active area pillars therebetween;

forming at least one conducting serpentine gate structure including a gate electrode on a gate dielectric; the gate structure running in a second direction transverse to the first direction and thereby defining source/drain regions in the active area pillars on opposing sides of the gate structure; and the gate dielectric being a substantially non-charge trapping dielectric that consists of a single layer dielectric film ; and implanting dopant of a second conductivity type to form source/drains in the source/drain regions;

wherein the recessed isolation trenches have trench space lengths and trench recess depths; and wherein two times the trench recess depths is greater than the trench space lengths.

2. The method of claim 1, wherein the wide transistor is selected from a group of devices comprising: logic, analog, power IC output, inverter switch and switch.

3. The method of claim 1, wherein the recessed isolation trenches are filled with insulative material selected from a group comprising: silicon dioxide ($SiO_2$), $ZrO_2$, $Al_2O_3$, high density plasma (HDP) oxide, and combinations thereof.

4. The method of claim 1, wherein the recessed isolation trenches have trench recess depths of approximately 10-100 nanometers deep.

5. The method of claim 1, wherein the recessed isolated trenches have trench recess space widths of approximately 40-200 nanometers wide.

6. The method of claim 1, further comprising using a first chemical mechanical polishing process to remove a portion of the nitride layer.

7. The method of claim 6, wherein a first deglaze process is executed after the first chemical mechanical polishing process.

8. The method of claim 7, wherein the first deglaze process comprises at least one of the following: a pre-furnace clean employing SC1, HF, SC2, and a vapor dry process.

9. The method of claim 7, wherein a second deglaze process is executed prior to forming the at least one serpentine gate structure; the gate electrode comprises polysilicon.

10. The method of claim 9, wherein the second deglaze process comprises at least one of the following: a pre-gate clean employing $H_2O_2$; a hot SC1 process employing HF, or $H_2O_2$, or both; and a vapor dry process.

11. The method of claim 1, wherein the first oxide layer has a thickness of 7-30 nanometers.

12. The method of claim 1, wherein the nitride layer has a thickness of 50-300 nanometers.

13. The method of claim 1, wherein the gate oxide layer has a thickness of 100-400 nanometers.

14. The method of claim 1, further comprising executing an annealing process prior to etching to create the isolation trenches.

15. The method of claim 1, further comprising executing a deglaze process subsequent to etching to create the isolation trenches.

16. The method of claim 15, wherein the deglaze process comprises at least one of the following: a pre-furnace clean employing SC1, HF, SC2 , and a vapor dry process.

17. A method of manufacturing a semiconductor device having a recessed shallow trench isolation (STI) structure, comprising:
    providing a semiconductor substrate having an outer field isolation region and an internal active region;
    forming a first hard mask layer and a photoresist layer, in that sequence, on the semiconductor substrate;
    patterning the hard mask layer and photoresist layer to form a plurality of STI trenches running in a first direction;
    forming the plurality of STI trenches through the first hard mask layer and through the photoresist layer and into the semiconductor substrate;
    forming a second hard mask layer inside of the plurality of STI trenches;
    filling the plurality of STI trenches with isolation material;
    planarizing the semiconductor substrate employing chemical mechanical polishing;
    etching the semiconductor substrate to form the plurality of STI trenches with recessed isolation material;
    forming a third hard mask patterned to reside under at least one serpentine gate structure;
    wherein a gate dielectric is a substantially non-charge trapping dielectric; and
    forming the at least one serpentine gate structure on the gate dielectric running in a second direction transverse to the first direction of the STI trenches;
    wherein a top surface of the active region is more narrow than a surface that is level with the recessed isolation material.

18. The method of claim 17, wherein the first hard mask comprises at least one of the following: an oxide layer, or a nitride layer, or both.

19. The method of claim 17, wherein the second hard mask comprises at least one of the following: an oxide layer, or a nitride layer, or both.

20. The method of claim 17, wherein the third hard mask comprises at least one of the following: an oxide layer, or a nitride layer, or both.

* * * * *